(12) United States Patent
Kim

(10) Patent No.: US 11,017,716 B2
(45) Date of Patent: May 25, 2021

(54) DISPLAY DEVICE AND METHOD OF MANUFACTURING THE SAME

(71) Applicant: SAMSUNG DISPLAY CO., LTD., Yongin-si (KR)

(72) Inventor: Sung Hoon Kim, Seoul (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 16/377,690

(22) Filed: Apr. 8, 2019

(65) Prior Publication Data
US 2019/0318689 A1    Oct. 17, 2019

(30) Foreign Application Priority Data

Apr. 11, 2018    (KR) .................. 10-2018-0042172

(51) Int. Cl.
| | |
|---|---|
| *G09G 3/30* | (2006.01) |
| *G09G 3/3225* | (2016.01) |
| *H01L 51/52* | (2006.01) |
| *H05K 1/02* | (2006.01) |

(52) U.S. Cl.
CPC ....... *G09G 3/3225* (2013.01); *H01L 51/5237* (2013.01); *H05K 1/028* (2013.01)

(58) Field of Classification Search
CPC ............. G09G 2300/0426; G09G 3/20; G09G 3/3225; H01L 2251/5338; H01L 27/3276; H01L 51/5237; H01L 51/5253; H05K 1/028
See application file for complete search history.

(56) References Cited

U.S. PATENT DOCUMENTS

2018/0092166 A1* 3/2018 Kim ..................... H05B 33/06

FOREIGN PATENT DOCUMENTS

| KR | 10-1416768 | 7/2014 |
|---|---|---|
| KR | 10-2017-0093835 | 8/2017 |
| KR | 10-2017-0125161 | 11/2017 |

* cited by examiner

*Primary Examiner* — Insa Sadio
(74) *Attorney, Agent, or Firm* — Lewis Roca Rothgerber Christie LLP

(57) ABSTRACT

A display device and a method of manufacturing a display device are provided. A display device may include: a display panel including a first area, a second area spaced apart from the first area, and a bending area between the first area and the second area; a driving circuit chip on the second area of the display panel; a flexible printed circuit board on the second area of the display panel and spaced apart from the driving circuit chip; and a bending protection layer including a first pre-formed bending protection layer covering a portion of the flexible printed circuit board, and a first post-formed bending protection layer covering the bending area of the display panel.

19 Claims, 8 Drawing Sheets

DISPLAY DEVICE AND METHOD OF MANUFACTURING THE SAME

CROSS-REFERENCE TO RELATED APPLICATION

This application claims priority to and the benefit of Korean Patent Application No. 10-2018-0042172, filed on Apr. 11, 2018 in the Korean Intellectual Property Office (KIPO), the entire disclosure of which is incorporated by reference herein.

BACKGROUND

1. Field

Aspects of embodiments relate to a display device. More particularly, aspects of embodiments relate to a display device including a bending area, and a method of manufacturing the display device.

2. Description of the Related Art

As information technology has developed, the market for display devices, which are connecting media between users and information, is increasing. Accordingly, usage of flat panel displays (FPDs), such as liquid crystal displays (LCDs), organic light-emitting diodes (OLEDs), and plasma display panels (PDPs) has increased.

At least a portion of the display device may be bent. Therefore, a visibility of the display device from various angles may be improved, and an area of a non-display region may be decreased. In a method of manufacturing the display device in which at least a portion thereof is bent, methods for minimizing or reducing damage and manufacturing cost have been studied.

SUMMARY

According to an aspect of embodiments of the present invention, a display device for preventing or reducing a driving circuit chip and a printed circuit board from being separated during a bending process and a method of manufacturing the display device are provided.

According to one or more embodiments, a display device includes: a display panel including a first area, a second area spaced apart from the first area, and a bending area between the first area and the second area; a driving circuit chip on the second area of the display panel; a flexible printed circuit board on the second area of the display panel and spaced apart from the driving circuit chip; and a bending protection layer including a first pre-formed bending protection layer covering a portion of the flexible printed circuit board, and a first post-formed bending protection layer covering the bending area of the display panel.

In an embodiment, the first post-formed bending protection layer may include a same material as that of the first pre-formed bending protection layer.

In an embodiment, the first pre-formed bending protection layer may include a photo-curable material. The first post-formed bending protection layer may include a thermo-curable material.

In an embodiment, a hardness of the first pre-formed bending protection layer may be greater than a hardness of the first post-formed bending protection layer.

In an embodiment, the first post-formed bending protection layer may cover the driving circuit chip.

In an embodiment, the first pre-formed bending protection layer may not overlap the driving circuit chip in a plan view.

In an embodiment, the first pre-formed bending protection layer may cover the driving circuit chip.

In an embodiment, the bending protection layer may further include a second pre-formed bending protection layer on the first area of the display panel.

In an embodiment, the bending protection layer may further include a third pre-formed bending protection layer on the second area of the display panel and spaced apart from the first pre-formed bending protection layer with the driving circuit chip therebetween, and a second post-formed bending protection layer between the first pre-formed bending protection layer and the third pre-formed bending protection layer and covering the driving circuit chip.

In an embodiment, a height of the first pre-formed bending protection layer may be lower than a height of the third pre-formed bending protection layer.

In an embodiment, a height of the second post-formed bending protection layer may be lower than a height of the first post-formed bending protection layer.

In an embodiment, the display device may further include a protective film opposite to the bending protection layer with the display panel in between and including an opening portion corresponding to the bending area of the display panel.

In an embodiment, the second pre-formed bending protection layer may overlap an end of the protective film which is exposed by the opening portion in a plan view.

In an embodiment, an upper surface of the first post-formed bending protection layer may be flat.

In an embodiment, the first post-formed bending protection layer may include a first layer on the display panel, and a second layer on the first layer and including a different material from that of the first layer.

In an embodiment, the display device may further include a polarization plate on the first area of the display panel. The bending protection layer may be in contact with the polarization plate.

According to one or more embodiments, a method of manufacturing a display device includes: forming a display panel including a first area, a second area spaced apart from the first area, and a bending area between the first area and the second area; attaching a driving circuit chip on the second area of the display panel; attaching a flexible printed circuit board spaced apart from the driving circuit chip on the second area of the display panel; forming a pre-formed bending protection layer covering a portion of the flexible printed circuit board; and forming a post-formed bending protection layer covering the bending area of the display panel.

In an embodiment, forming the pre-formed bending protection layer may include coating a photo-curable material on the second area of the display panel and the portion of the flexible printed circuit board, and pre-curing the photo-curable material with an ultraviolet light.

In an embodiment, forming the post-formed bending protection layer may include coating a thermo-curable material on the bending area of the display panel, and curing the thermo-curable material with heat.

In an embodiment, forming the post-formed bending protection layer may be performed after forming the pre-formed bending protection layer.

According to an aspect of embodiments, the bending protection layer of the display device may include the pre-formed bending protection layer covering a portion of the flexible printed circuit board and the post-formed bending protection layer covering the bending area of the display panel and the driving circuit chip. Accordingly, separation of the driving circuit chip and the flexible printed circuit board from the display panel may be prevented or substantially prevented during the process of bending the display device.

BRIEF DESCRIPTION OF THE DRAWINGS

Some illustrative, non-limiting embodiments will be more clearly understood from the following detailed description, taken in conjunction with the accompanying drawings.

DETAILED DESCRIPTION

Herein, display devices and methods of manufacturing display devices in accordance with some embodiments of the present invention will be explained in further detail with reference to the accompanying drawings.

Figure 1:
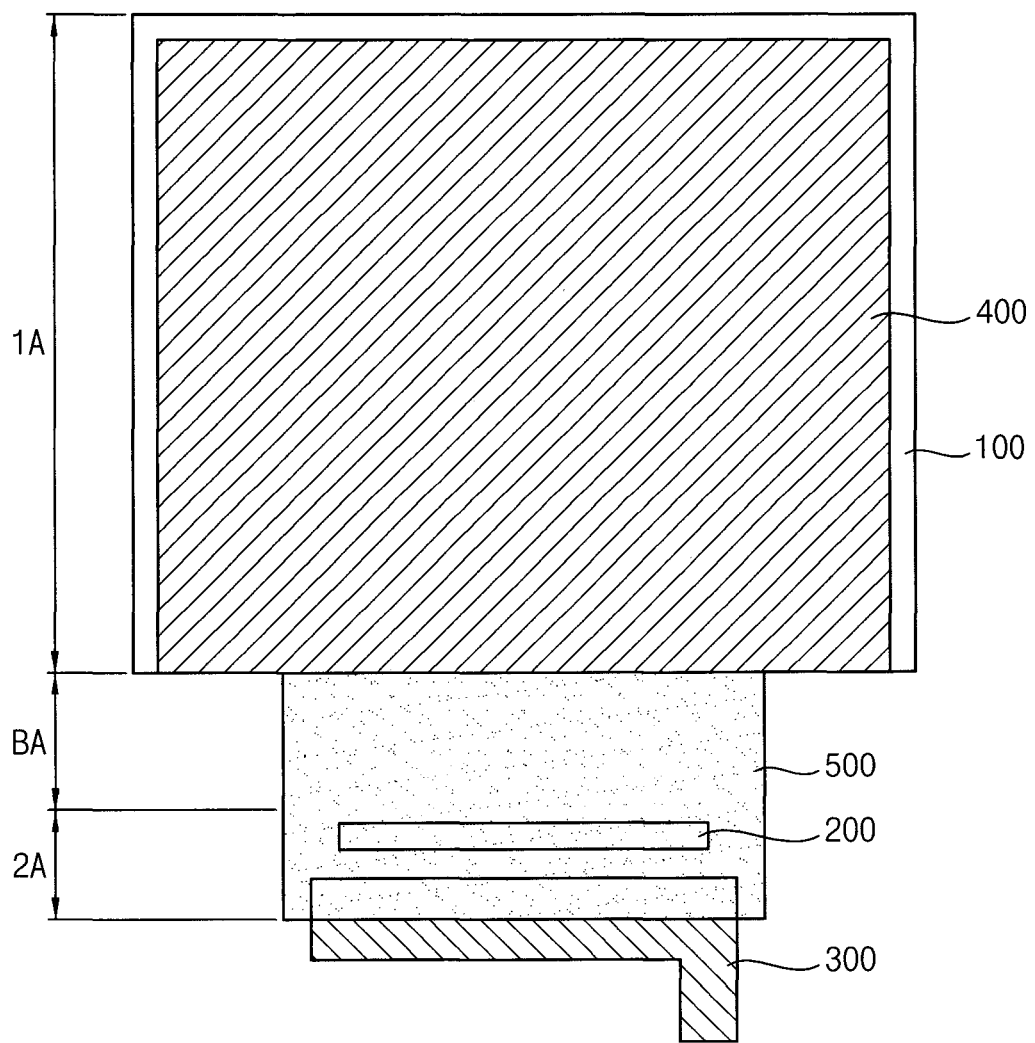
FIG. 1 is a plan view illustrating a display device according to an embodiment.
Figure 2:
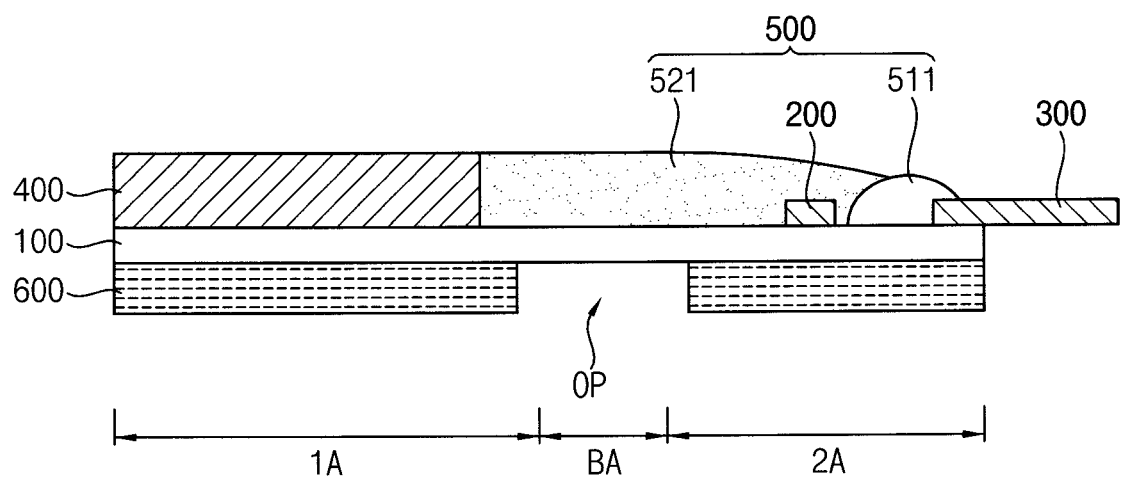
FIGS. 2 and 3 are cross-sectional views illustrating a display device according to an embodiment.
Figure 3:
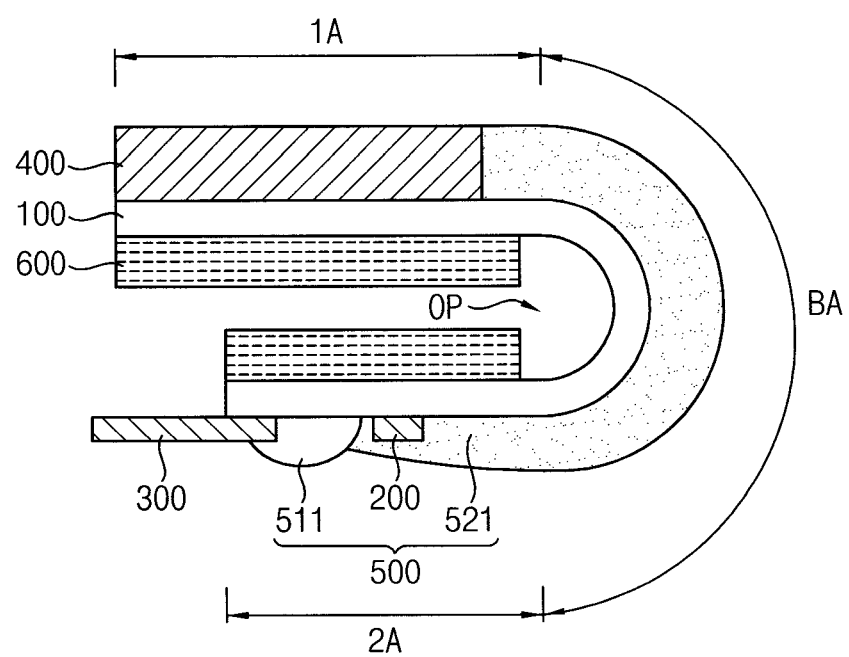

FIG. 1 is a plan view illustrating a display device according to an embodiment; and FIGS. 2 and 3 are cross-sectional views illustrating a display device according to an embodiment. For example, FIG. 3 may illustrate the display device in FIG. 2 in a bent state.

Referring to FIGS. 1, 2, and 3, a display device according to an embodiment may include a display panel 100, a driving circuit chip 200, a flexible printed circuit board 300, a polarization plate 400, a bending protection layer 500, and a protective film 600.

The display device may display an image. The display device may be a liquid crystal display, an electrophoretic display, an organic light emitting display, an inorganic light emitting display, a field emission display, a surface-conduction electron-emitter display, a plasma display, a cathode ray display, or the like. Herein, an organic light emitting display device will be described as an example of the display device according to an embodiment. However, the display device according to the present embodiment is not limited thereto, and any of various display devices may be used.

The display panel 100 may have a first area 1A, a second area 2A, and a bending area BA. The second area 2A may be spaced apart from the first area 1A, and the bending area BA may be located between the first area 1A and the second area 2A. The bending area BA may be bent around a bending axis as illustrated in FIG. 3.

The driving circuit chip 200 and the flexible printed circuit board 300 may be disposed on the second area 2A of the display panel 100. The driving circuit chip 200 may be disposed in the second area 2A, and the flexible printed circuit board 300 may be disposed on an end portion of the second area 2A. The driving circuit chip 200 and the flexible printed circuit board 300 may be spaced apart from each other.

The driving circuit chip 200 and the flexible printed circuit board 300 may provide driving signals to the display panel 100. The driving signals may include any of various signals for driving the display device, such as driving voltage, a gate signal, a data signal, or the like. Although it is not illustrated in figures, the flexible printed circuit board 300 may be connected to a printed circuit board generating the driving signals.

The polarization plate 400 may be disposed on the first area 1A of the display panel 100. The polarization plate 400 may reduce reflection of external light. For example, when the external light having passed through the polarization plate 400 is reflected from an upper portion of the display panel 100 and then passes through the polarization plate 400 again, a phase of the reflected external light may be changed as the incoming external light passes through the polarization plate 400 twice. As a result, a phase of reflected external light may be different from the phase of the incoming external light entering the polarization plate 400 to the extent that a destructive interference occurs. Accordingly, the reflection of external light may be reduced to increase visibility of the display device.

The bending protection layer 500 may be disposed on the second area 2A and the bending area BA of the display panel 100. When a stack structure is bent, there is a stress neutral plane in the stack structure. If the bending protection layer 500 does not exist, an excessive tensile stress may be applied, when the display panel 100 is bent, to a conductive layer in the bending area BA because the conductive layer may not be in the stress neutral plane. However, the bending protection layer 500 may be formed on the bending area BA, and a thickness and a modulus of the bending protection layer 500 may be controlled such that the location of the stress neutral plane in the stack structure including the display panel 100, the bending protection layer 500, etc. may be adjusted. The location of the stress neutral plane may be around the conductive layer by forming the bending protection layer 500. Accordingly, a tensile stress applied to the conductive layer may be minimized or reduced.

In an embodiment, the bending protection layer 500 may include a first pre-formed bending protection layer 511 and a first post-formed bending protection layer 521. In a process of forming the bending protection layer 500, the first post-formed bending protection layer 521 may be formed after the formation of the first pre-formed bending protection layer 511.

The first pre-formed bending protection layer 511 may be disposed on the second area 2A of the display panel 100. The first pre-formed bending protection layer 511 may cover a portion of the flexible printed circuit board 300. For example, the first pre-formed bending protection layer 511 may cover an end portion of the flexible printed circuit board 300 which is located on an end portion of the second area 2A. The first pre-formed bending protection layer 511 may fix the flexible printed circuit board 300 on the display panel 100 so as not to be separated from the display panel 100. Further, the first pre-formed bending protection layer 511 may prevent or substantially prevent the first post-formed bending protection layer 521 from overflowing in a process of forming the first post-formed bending protection layer 521.

In an embodiment, the first pre-formed bending protection layer 511 may not overlap the driving circuit chip 200 in a plan view. In other words, the first pre-formed bending protection layer 511 may not cover the driving circuit chip 200.

The first post-formed bending protection layer 521 may be disposed on the bending area BA of the display panel 100. In other words, the first post-formed bending protection layer 521 may cover the bending area BA of the display panel 100. The first post-formed bending protection layer 521 may adjust the location of a stress neutral plane in the bending area BA.

In an embodiment, the first post-formed bending protection layer 521 may be further formed on the second area 2A of the display panel 100, and may cover the driving circuit chip 200. For example, the first post-formed bending protection layer 521 may be in contact with the first pre-formed bending protection layer 511, and may substantially cover the driving circuit chip 200. In this case, the first post-formed bending protection layer 521 may fix the driving circuit chip 200 on the display panel 100 so as not to be separated from the display panel 100.

In an embodiment, a hardness of the first pre-formed bending protection layer 511 may be greater than a hardness of the first post-formed bending protection layer 521. The first pre-formed bending protection layer 511 may be located on the unbent second area 2A, and may cover a portion of the flexible printed circuit board 300 to fix the flexible printed circuit board 300 on the display panel 100. Accordingly, the first pre-formed bending protection layer 511 may have a relatively high hardness. When the bending area BA of the display panel 100 is bent, the first post-formed bending protection layer 521 covering the bending area BA may be extended, and may receive a tensile stress. Accordingly, the first post-formed bending protection layer 521 may have a relatively low hardness.

In an embodiment, the bending protection layer 500 may be in contact with the polarization plate 400. For example, an end portion of the first post-formed bending protection layer 521 located on the first area 1A of the display panel 100 may be contact with an end portion of the polarization plate 400. In an embodiment, the bending protection layer 500 may be formed by applying and hardening a liquid phase material or a paste-type material. The volume of the bending protection layer 500 may be reduced during a hardening process. As described above, the end portion of the bending protection layer 500 is in contact with the polarization plate 400 to the extent that the bending protection layer 500 is fixed at the boundary between the bending protection layer 500 and the polarization plate 400, and, thus, the volume reduction occurs in the remaining portion of the bending protection layer 500 which is not in contact with the polarization plate 400. As a result, a thickness of a portion of the bending protection layer 500 which is located on the first area 1A of the display panel 100 may be greater than thicknesses of portions of the bending protection layer 500 which are located on the second area 2A and the bending area BA of the display panel 100.

The protective film 600 may be disposed to be opposite to the polarization plate 400 and the bending protection layer 500 with the display panel 100 therebetween. For example, the polarization plate 400 and the bending protection layer 500 may be formed on an upper surface of the display panel 100, and the protective film 600 may be formed on a lower surface opposite to the upper surface of the display panel 100.

The protective film 600 may have an opening portion OP corresponding to the bending area BA of the display panel 100. The protective film 600 may have rigidity sufficient to protect the lower surface of the display panel 100. If the protective film 600 is inflexible, the protective film 600, if not having the opening portion OP, may be separated from the display panel 100 in the process of bending the display panel 100. However, the protective film 600 according to the present embodiment may have the opening portion OP corresponding to the bending area BA, and may prevent or substantially prevent the protective film 600 from being separated from the display panel 100 in the process of bending the display panel 100.

In an embodiment, a width of the opening portion OP may be greater than a width of the bending area BA. For example, the bending area BA may be located in the opening portion OP. Accordingly, the protective film 600 may not be disposed in the bending area BA of the display panel 100.

Figure 4:
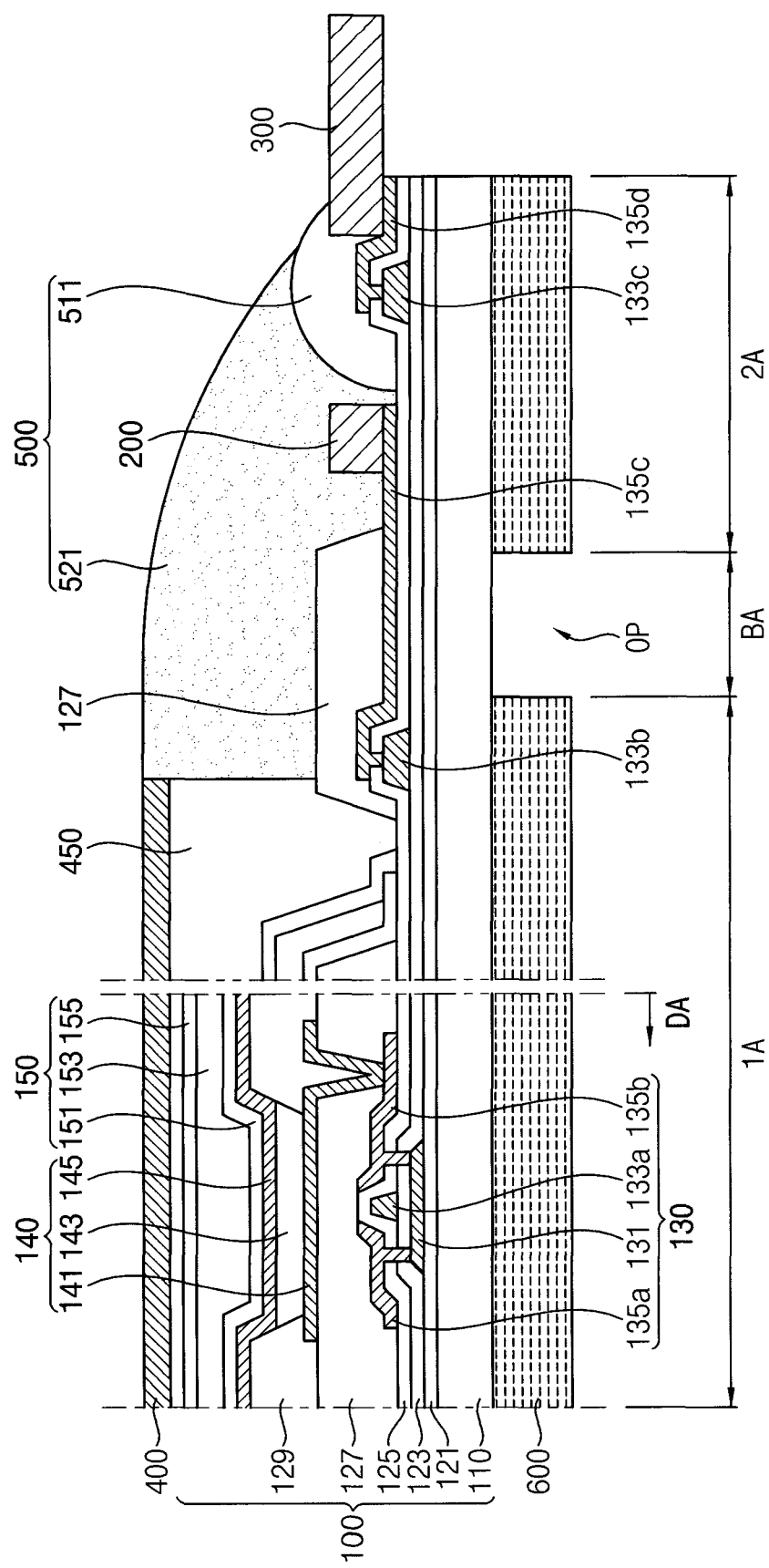
FIGS. 4 and 5 are enlarged cross-sectional views illustrating a portion of the display device of FIG. 2 and a variation thereof, respectively.
Figure 5:
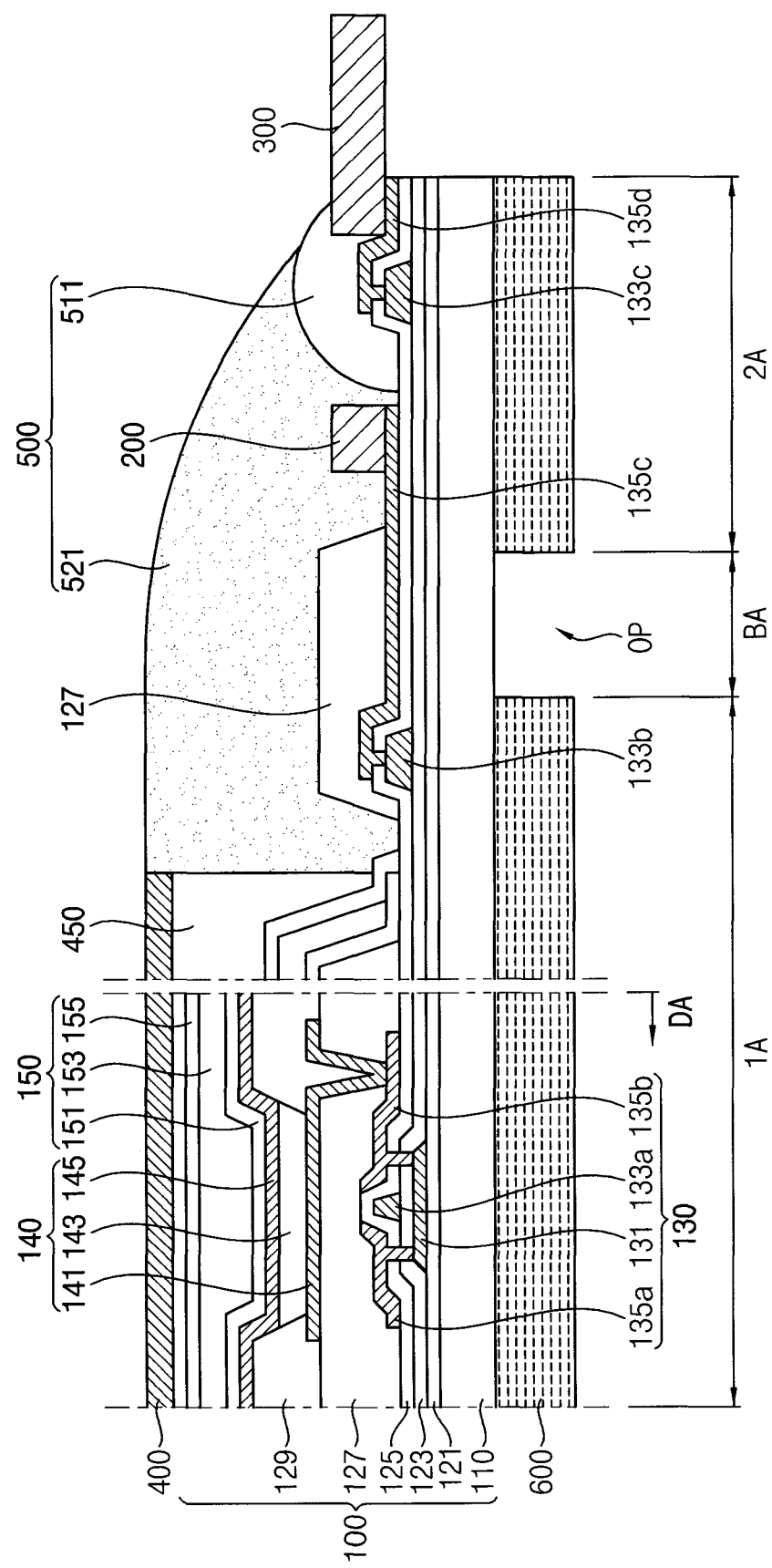

FIGS. 4 and 5 are enlarged cross-sectional views illustrating a portion of the display device of FIG. 2 and a variation thereof, respectively.

Referring to FIG. 4, in an embodiment, the display panel 100 may include a substrate 110, insulation layers 121, 123, 125, 127, and 129, a thin film transistor 130, an organic light emitting element 140, an encapsulation layer 150, or the like.

The first area 1A of the display panel 100 may include a display area DA. The first area 1A may include a portion of a non-display area outside the display area DA together with the display area DA, as illustrated in FIG. 4. The second area 2A and the bending area BA may also include the non-display area.

A plurality of pixels may be disposed in the display area DA of the display panel 100 such that an image may be displayed. The display area DA may include a switching element such as the thin film transistor 130, a display element such as the organic light emitting element 140, or the like. The display area DA may further include signal wirings, such as a gate line for transferring a gate signal, a data line for transferring a data signal, a driving power line for supplying power, a common power line, etc. A pixel may be formed by electrically coupling the thin film transistor 130, the organic light emitting element 140, etc. that are connected to the gate line, the data line, the driving power line, and the common power line such that an image may be displayed. The pixel may emit light with brightness corresponding to a driving current passing through the organic light emitting element 140 in response to the data signal according to driving power and common power supplied to the pixel. The plurality of pixels may be configured and disposed in any of various ways, such as a stripe layout, a pentile layout, etc.

The substrate 110 may include any of various materials having flexible characteristics. For example, the substrate 110 may include a polymer resin, such as polyether sulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), or cellulose acetate propionate (CAP). The substrate 110 may have a single-layer or multi-layer structure. In an embodiment, the substrate 110 may have a structure in which a resin layer including a resin and a barrier layer including an inorganic material, such as silicon oxide or silicon nitride, are alternately stacked, or a structure further including an intermediate layer including amorphous silicon between the resin layer and the barrier layer.

The thin film transistor 130 may include a semiconductor layer 131, a gate electrode 133a, a source electrode 135a, and a drain electrode 135b. In an embodiment, the semiconductor layer 131 may include amorphous silicon, polycrystalline silicon, an oxide semiconductor, or an organic semiconductor material.

The gate electrode 133a may be connected to a gate wiring (not shown) for transferring on and off signals to the thin film transistor 130. The gate electrode 133a may include a low-resistive conductive material. For example, the gate electrode 133a may be a single-layer or a multi-layer including a conductive material including, for example, molybdenum (Mo), aluminum (Al), copper (Cu), titanium (Ti), or the like.

Each of the source electrode 135a and the drain electrode 135b may be a single-layer or a multi-layer including a conductive material having high conductivity. The source electrode 135a and the drain electrode 135b may be respectively connected to a source area and a drain area of the semiconductor layer 131. For example, each of the source electrode 135a and the drain electrode 135b may be a single-layer or a multi-layer including a conductive material including, for example, Al, Cu, Ti, or the like.

In an embodiment, the thin film transistor 130 is a top gate type transistor in which the gate electrode 133a is disposed over the semiconductor layer 131. However, the present invention is not limited thereto. In another embodiment, the thin film transistor may be a bottom gate type transistor in which the gate electrode is disposed under the semiconductor layer.

To obtain an insulating property between the semiconductor layer 131 and the gate electrode 133a, a gate insulation layer 123 may be disposed between the semiconductor layer 131 and the gate electrode 133a. The gate insulation layer 123 may include an inorganic material, such as silicon oxide, silicon nitride, silicon oxynitride, or the like. Further, an insulation interlayer 125 including an inorganic material, such as silicon oxide, silicon nitride, silicon oxynitride, or the like, may be disposed on the gate electrode 133a. The source electrode 135a and the drain electrode 135b may be disposed on the insulation interlayer 125. The insulation layer such as the gate insulation layer 123 and the insulation interlayer 125 including the inorganic material described above may be formed by a chemical vapor deposition (CVD) process or an atomic layer deposition (ALD) process.

The source electrode 135a and the drain electrode 135b may be connected to the semiconductor layer 131 via contact holes. In an embodiment, he contact holes may be formed by concurrently (e.g., simultaneously) etching the gate insulation layer 123 and the insulation interlayer 125.

In an embodiment, a buffer layer 121 including an inorganic material, such as silicon oxide, silicon nitride, silicon oxynitride, or the like, may be interposed between the thin film transistor 130 and the substrate 110. The buffer layer 121 may have a single-layer or multi-layer structure. The buffer layer 121 may increase smoothness of an upper surface of the substrate 110. The buffer layer 121 may also serve to prevent, minimize, or reduce infiltration of impurities through the substrate 110, etc. into the semiconductor layer 131 of the thin film transistor 130.

A planarization layer 127 may be disposed on the thin film transistor 130. For example, when the organic light emitting element 140 is disposed on the thin film transistor 130 as shown in FIG. 4, the planarization layer 127 may cover the thin film transistor 130, providing a planarized surface for manufacturing the organic light emitting element 140 on the thin film transistor 130. The planarization layer 127 may be formed of an organic material, such as acryl, benzocyclobutene (BCB), hexamethyldisiloxane (HMDSO), or the like. The planarization layer 127 illustrated in FIG. 4 has a single-layered structure. However, the present invention is not limited thereto. For example, the planarization layer 127 may have any of variously modified structures, such as a multi-layered structure.

The planarization layer 127 may have an opening outside the display area DA such that a portion of the planarization layer 127 within the display area DA and a portion of the planarization layer 127 outside the display area DA may be physically separated from each other through the opening. Thus, impurities from the planarization layer 127 may be prevented or substantially prevented from infiltrating the display area DA.

The organic light emitting element 140 including a pixel electrode 141, an opposite electrode 145, and an intermediate layer 143 interposed between the pixel electrode 141 and the opposite electrode 145 may be disposed on the planarization layer 127 on the display area DA. The intermediate layer 143 may include an emission layer. The pixel electrode 141 may be electrically connected to the thin film transistor 130 by contacting one of the source electrode 135a and the drain electrode 135b via an opening formed in the planarization layer 127.

A pixel defining layer 129 may be disposed on the planarization layer 127. The pixel defining layer 129 may have an opening corresponding to each pixel. For example, the opening of the pixel defining layer 129 may expose at least a center portion of the pixel electrode 141 to define the pixel. The pixel defining layer 129 may increase a distance between an edge of the pixel electrode 141 and the opposite electrode 145 above the pixel electrode 141 to prevent or substantially prevent an electric arc from being generated from an end portion of the pixel electrode 141. In an embodiment, the pixel defining layer 129 may be formed of an organic material, such as PI or HMDSO.

In an embodiment, the intermediate layer 143 of the organic light emitting element 140 may include a low-molecular weight material or a polymer material. In an embodiment, when the intermediate layer 143 includes the low-molecular weight material, the intermediate layer 143 may have a single or multi-layered structure including a hole injection layer (HIL), a hole transport layer (HTL), an emission layer (EML), an electron transport layer (ETL), and an electron injection layer (EIL), and may include any of various organic materials including copper phthalocyanine (CuPc), N,N'-Di(naphthalene-1-yl)-N,N'-diphenyl-benzidine (NPB), and tris-8-hydroxyquinoline aluminum (Alq3). The layers may be formed by using a vacuum deposition method, etc.

When the intermediate layer 143 includes the polymer material, the intermediate layer 143 may have a structure including an HTL and an EML. In this case, the HTL may include Poly(3,4-ethylenedioxythiphene):poly(4-styrene-sulfonate) (PEDOT:PSS), and the EML may include a polymer material, such as a poly-phenylenevinylene (PPV)-based material and a polyfluorene-based material. The intermediate layer 143 may be formed using a screen printing method, an inkjet printing method, a laser induced thermal imaging (LITI) method, or the like.

However, the present invention is not limited thereto. For example, the intermediate layer 143 may include a layer that is continuously formed on a plurality of pixel electrodes 141 or a layer that is patterned to correspond to each of the plurality of pixel electrodes 141.

The opposite electrode 145 may be disposed on the display area DA, covering the display area DA, as shown in FIG. 4. In an embodiment, the opposite electrode 145 may be continuously formed in a plurality of organic light emitting elements 140 and, thus, may overlap the plurality of pixel electrodes 141.

Since the organic light emitting element 140 may be easily damaged by external moisture or oxygen, the encapsulation layer 150 may cover and protect the organic light emitting element 140. The encapsulation layer 150 may cover the display area DA, and may extend to the outside of the display area DA. In an embodiment, the encapsulation layer 150 may include a first inorganic encapsulation layer 151, an organic encapsulation layer 153, and a second inorganic encapsulation layer 155.

The first inorganic encapsulation layer 151 may cover the opposite electrode 145. In an embodiment, the first inorganic encapsulation layer 151 may include silicon oxide, silicon nitride, silicon oxynitride, or the like. Other layers such as a capping layer may be disposed between the first inorganic encapsulation layer 151 and the opposite electrode 145. Since the first inorganic encapsulation layer 151 is conformally formed on the opposite electrode 145, an upper surface of the first inorganic encapsulation layer 151 may not be flat. The organic encapsulation layer 153 may cover the first inorganic encapsulation layer 151. Unlike the first inorganic encapsulation layer 151, an upper surface of the organic encapsulation layer 153 may be flat. For example, the organic encapsulation layer 153 may have a flat upper surface at a portion corresponding to the display area DA. For example, the organic encapsulation layer 153 may include PET, PEN, PC, PI, polyethylene sulfonate, polyoxymethylene, PAR, or HMDSO.

The second inorganic encapsulation layer 155 may be disposed on the organic encapsulating layer 153, covering the organic encapsulation layer 153. In an embodiment, the second inorganic encapsulation layer 155 may include silicon oxide, silicon nitride, silicon oxynitride, or the like. In an embodiment, an edge of the second inorganic encapsulation layer 155 outside the display area DA may contact the first inorganic encapsulation layer 151 such that the organic encapsulation layer 153 may not be exposed to the outside.

In an embodiment, since the encapsulation layer 150 includes the first inorganic encapsulation layer 151, the organic encapsulation layer 153, and the second inorganic encapsulation layer 155, a crack created in the encapsulation layer 150 may not propagate between the first inorganic encapsulation layer 151 and the organic encapsulation layer 153 or between the organic encapsulation layer 153 and the second inorganic encapsulation layer 155. Accordingly, formation of a path through which external moisture or oxygen infiltrates into the display area DA may be prevented, minimized, or reduced.

In an embodiment, the polarization plate 400 may be attached to the encapsulation layer 150 by using an optically clear adhesive (OCA) 450. The optically clear adhesive 450 and the polarization plate 400 may cover at least a portion of the opening of the planarization layer 127. However, the present invention is not limited thereto. For example, the polarization plate 400 may be omitted or other configurations of the polarization plate 400 may be used. For example, if the polarization plate 400 is omitted, a black matrix and a color filter may serve to reduce the reflection of incoming external light.

In an embodiment, the optically clear adhesive 450 and the polarization plate 400 may substantially cover an end of the encapsulation layer 150 located outside of the display area DA, as shown in FIG. 4. In this case, the bending protection layer 500 adjacent to the polarization plate 400 may not be in contact with the encapsulation layer 150. In another embodiment, the optically clear adhesive 450 and the polarization plate 400 may not cover a portion of an end of the encapsulation layer 150 located outside of the display area DA, as shown in FIG. 5. In other words, the portion of the end of the encapsulation layer 150 may be exposed. In this case, the bending protection layer 500 adjacent to the polarization plate 400 may be in contact with the encapsulation layer 150 at the outside of the display area DA.

The display device according to the present embodiment may include a first conductive layer 135c disposed on the inorganic insulation layer including the buffer layer 121, the gate insulation layer 123, and the insulation interlayer 125. The first conductive layer 135c may be extended from the first area 1A to the second area 2A through the bending area BA. The first conductive layer 135c may serve as a wiring through which an electrical signal is transmitted to the display area DA. In an embodiment, the first conductive layer 135c may be formed concurrently (e.g., simultaneously) with the source electrode 135a or the drain electrode 135b by using the same material as a material of the source electrode 135a or the drain electrode 135b.

The display device according to the present embodiment may further include second conductive layers 133b and 133c and a third conductive layer 135d. The third conductive layer 135d may be disposed on the same level as that of the first conductive layer 135c. The second conductive layers 133b and 133c may be disposed in the first area 1A and the second area 2A, respectively. The second conductive layers 133b and 133c may be located at a different level from that of the first conductive layer 135c. The second conductive layers 133b and 133c may be electrically connected to the first conductive layer 135c or the third conductive layer 135d.

In an embodiment, the second conductive layers 133b and 133c may be located at the same level as that of the gate electrode 133a of the thin film transistor 130. The first conductive layer 135c may contact the second conductive layer 133b located in the first area 1A via a contact hole formed in the insulation interlayer 125. The third conductive layer 135d may be in contact with the second conductive layer 133c located in the second area 2A.

The second conductive layer 133b located in the first area 1A may be electrically connected to a thin film transistor in the display area DA, and, thus, the first conductive layer 135c may be electrically connected to the thin film transistor in the display area DA via the second conductive layer 133b. The second conductive layer 133c located in the second area 2A may also be electrically connected to the thin film transistor in the display area DA.

The first conductive layer 135c that extends across the bending area BA may include a material having an elongation rate to the extent that the occurrence of a crack in the first conductive layer 135c or a defect such as a disconnection in the first conductive layer 135c may be prevented or substantially prevented.

In an embodiment, the second conductive layers 133b and 133c may include a material having a lower elongation rate than an elongation rate of the first conductive layer 135c and electrical/physical characteristics different from electrical/physical characteristics of the first conductive layer 135c. The second conductive layers 133b and 133c may be formed in the first area 1A and the second area 2A, respectively. Accordingly, efficiency of transmitting an electrical signal in the display device may increase, or a defect rate during the manufacturing processes may be reduced. In an embodiment, for example, the second conductive layers 133b and 133c may include molybdenum, and the first conductive layer 135c may include aluminum. In an embodiment, the first conductive layer 135c and the second conductive layers 133b and 133c may have multi-layered structures.

In an embodiment, the first conductive layer 135c and the third conductive layer 135d may be concurrently (e.g., simultaneously) formed when the source electrode 135a and the drain electrode 135b are formed. In an embodiment, the second conductive layers 133b and 133c may be concurrently (e.g., simultaneously) formed when the gate electrode 133a is formed.

The driving circuit chip 200 and the flexible printed circuit board 300 may be disposed on the second area 2A of the display panel 100. The driving circuit chip 200 may be disposed within the second area 2A, and the flexible printed circuit board 300 may be disposed on an end portion of the second area 2A.

The driving circuit chip 200 and the flexible printed circuit board 300 may be connected to the first conductive layer 135c, the second conductive layer 133c, and the third conductive layer 135d that are disposed on the second area 2A and/or other conductive layers electrically connected to the first conductive layer 135c, the second conductive layer 133c, and the third conductive layer 135d. In an embodiment, the driving circuit chip 200 may be disposed on an end of the first conductive layer 135c, and the flexible printed circuit board 300 may be connected to an end of the third conductive layer 135d. However, the present invention is not limited thereto. For example, the driving circuit chip 200 and the flexible printed circuit board 300 may be connected to the second conductive layer 133c or other conductive layers.

The bending protection layer 500 may be disposed on the bending area BA of the display panel 100. The bending protection layer 500 may cover the driving circuit chip 200 and a portion of the flexible printed circuit board 300. For example, as shown in FIG. 4, the first pre-formed bending protection layer 511 may cover an end portion of the flexible printed circuit board 300 located on an end of the second area 2A and the third conductive layer 135d. Further, the first post-formed bending protection layer 521 may cover the first conductive layer 135c located on the bending area BA and the driving circuit chip 200 located on the second area 2A.

An end portion of the bending protection layer 500 located on the first area 1A may be in contact with the polarization plate 400 and the optically clear adhesive 450, as shown in FIG. 4. However, the present invention is not limited thereto. In an embodiment, the end portion of the bending protection layer 500 may be spaced apart from the polarization plate 400 and the optically clear adhesive 450.

In an embodiment, the bending protection layer 500 may be formed of substantially the same material as those of the planarization layer 127, the pixel defining layer 129, and the organic encapsulation layer 153 of the encapsulation layer 150. For example, the bending protection layer 500 may be formed of an organic material, such as acryl, BCB, HMDSO, or the like.

In an embodiment, the first pre-formed bending protection layer 511 and the first post-formed bending protection layer 521 may include substantially the same material. In this case, a manufacturing cost and a manufacturing time may be reduced by forming the first pre-formed bending protection layer 511 and the first post-formed bending protection layer 521 with the same material.

In another embodiment, the first pre-formed bending protection layer 511 and the first post-formed bending protection layer 521 may include different materials from each other. For example, the first pre-formed bending protection layer 511 may include a photo-curable material, and the first post-formed bending protection layer 521 may include a thermo-curable material. In this case, the first pre-formed bending protection layer 511 and the first post-formed bending protection layer 521 may be cured by different curing processes from each other, and a hardness of the first pre-formed bending protection layer 511 and a hardness of the first post-formed bending protection layer 521 may be different from each other.

The protective film 600 may be disposed on a lower surface of the substrate 110. The protective film 600 may have an opening portion OP corresponding to the bending area BA of the display panel 100. An adhesive layer (not shown) including a pressure sensitive adhesive (PSA), etc. for attaching the protective film 600 to the substrate 110 may be interposed between the substrate 110 and the protective film 600.

Figure 6:
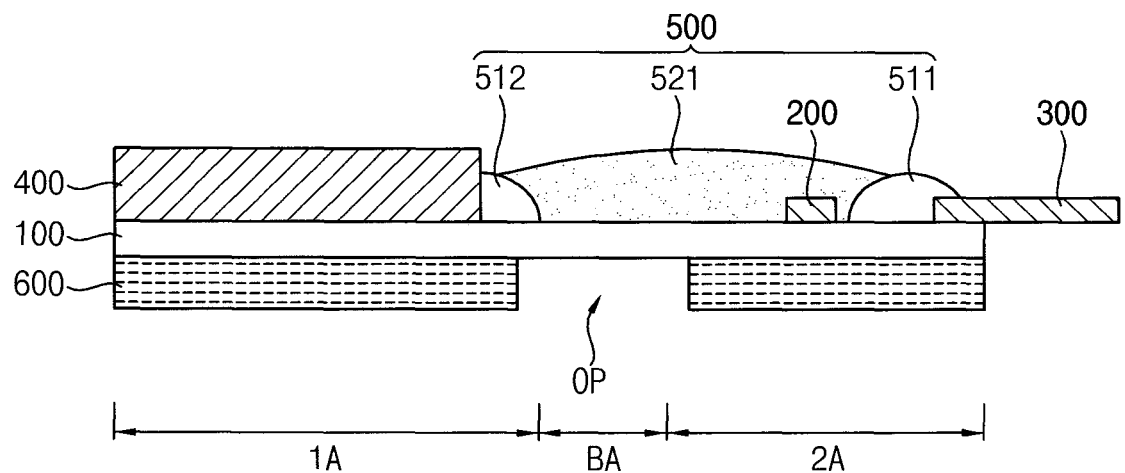
FIG. 6 is a cross-sectional view illustrating a display device according to an embodiment.

FIG. 6 is a cross-sectional view illustrating a display device according to an embodiment.

Referring to FIG. 6, a display device according to an embodiment may include a display panel 100, a driving circuit chip 200, a flexible printed circuit board 300, a polarization plate 400, a bending protection layer 500, and a protective film 600. Further detailed descriptions of elements of the display device according to an embodiment with reference to FIG. 6, which are substantially the same as or similar to those of the display device according to an embodiment with reference to FIG. 2, may be omitted.

The bending protection layer 500 may include a first pre-formed bending protection layer 511, a second pre-formed bending protection layer 512, and a first post-formed bending protection layer 521. In the formation of the bending protection layer 500, the first post-formed bending protection layer 521 may be formed after the formation of the first pre-formed bending protection layer 511 and the second pre-formed bending protection layer 512.

The second pre-formed bending protection layer 512 may be disposed on the first area 1A of the display panel 100. In an embodiment, the second pre-formed bending protection layer 512 may be adjacent to the polarization plate 400, and may be disposed on a portion of the fist area 1A which is adjacent to the bending area BA. The second pre-formed bending protection layer 512 may prevent or substantially prevent the first post-formed bending protection layer 521 from overflowing during the formation of the first post-formed bending protection layer 521.

In an embodiment, the second pre-formed bending protection layer 512 may overlap an end of the protective film 600 which is exposed by the opening portion OP in a plan view. A width of the opening portion OP may be greater than a width of the bending area BA. An edge of the second pre-formed bending protection layer 512 may be adjacent to a boundary between the first area 1A and the bending area BA. Accordingly, the second pre-formed bending protection layer 512 may overlap a portion of the opening portion OP in a plan view.

Figure 7:
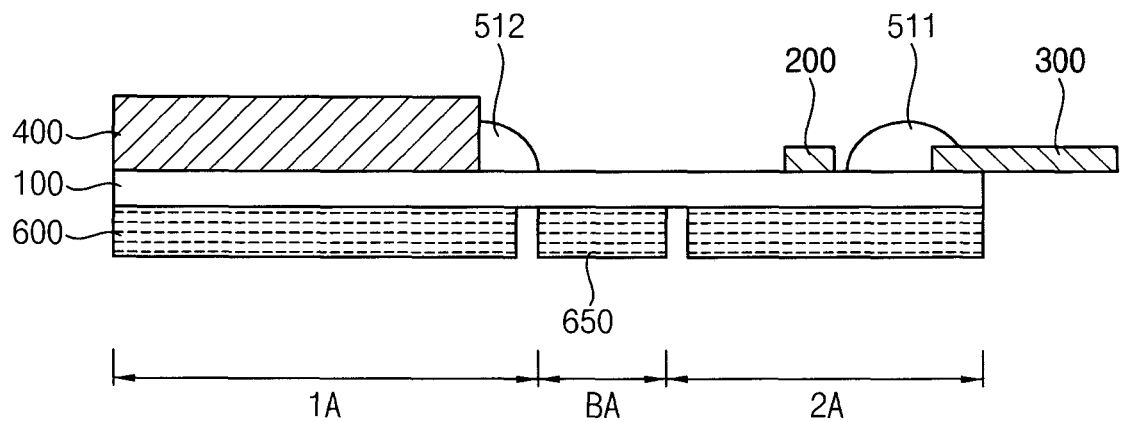
FIG. 7 is a cross-sectional view illustrating a method of manufacturing the display device of FIG. 6.

FIG. 7 is a cross-sectional view illustrating a method of manufacturing the display device of FIG. 6.

Referring to FIG. 7, in a method of manufacturing a display device according to an embodiment, the display panel 100 may be formed, the driving circuit chip 200 and the flexible printed circuit board 300 may be attached, and the pre-formed bending protection layers 511 and 512 may be formed.

First, as described above with reference to FIG. 4, the thin film transistor 130, the conductive layers 133b, 133c, and 135d, the organic light emitting element 140, and the encapsulation layer 150 may be sequentially formed on the substrate 110 to form the display panel 100. The polarization plate 400 may be formed on the first area 1A of the display panel 100 by the optically clear adhesive 450. Further, the protective film 600 and a support film 650 may be attached to a lower surface of the display panel 100. The protective film 600 may correspond to the first area 1A and the second area 2A of the display panel 100, and the support film 650 may correspond to the bending area BA.

Then, the driving circuit chip 200 and the flexible printed circuit board 300 spaced apart from each other may be attached on the second area 2A of the display panel 100. The driving circuit chip 200 may be attached within the second area 2A, and the flexible printed circuit board 300 may be attached to an end of the second area 2A.

In an embodiment, the driving circuit chip 200 and the flexible printed circuit board 300 may be attached on the display panel 100 by applying pressure and heat thereto by a pressure bonding device. In this case, an anisotropic conducting film (ACF) may be used as an adhesive for the driving circuit chip 200 and the flexible printed circuit board 300. In an embodiment, the ACF may include an adhesive agent cured by heat. In an embodiment, he AFC may be configured as a double-sided tape including fine conducting particles containing the adhesive agent. The fine conducting particles are mixed and distributed in the double-sided tape. Thus, if pressure is applied to upper and lower portions of the ACF, the fine conducting particles may burst and the adhesive agent in the fine conducting particles may cover the double-sided tape such that the ACF may have both conductive and adhesive properties.

The support film 650 may serve to minimize or reduce deformation of the substrate 110 during a process of bonding the driving circuit chip 200 and the flexible printed circuit board 300. During the bonding process, a heat treatment may be applied such that without the support film 650, the substrate 110 may droop in a lower direction. If the drooped substrate 110 is hardened with the temperature cooled down, the drooped substrate 110 may have a curvature to the extent that a crack may occur in the bending area BA in a bending process later. If the bending protection layer 500 that will be described below is formed on the drooped substrate 110, a thickness of the bending protection layer 500 may not be uniform, and, thus, a radius of curvature may not be uniformly formed and a crack may occur in the bending area BA when the substrate 110 is bent. In the present embodiment, the support film 650 is attached to a lower surface of the bending area BA of the display panel 100, thereby preventing, minimizing, or reducing drooping of the substrate 110 in the process of bonding the driving circuit chip 200 and the flexible printed circuit board 300.

Then, the pre-formed bending protection layers 511 and 512 may be formed on the display panel 100. The first pre-formed bending protection layer 511 may be formed on the second area 2A of the display panel 100 to cover the flexible printed circuit board 300. The second pre-formed bending protection layer 512 may be formed on the first area 1A of the display panel 100 to be adjacent to the polarization plate 400.

In an embodiment, a photo-curable material may be applied on an end of the flexible printed circuit board 300, the second area 2A of the display panel 100 adjacent to the end of the flexible printed circuit board 300, and the first area 1A of the display panel 100 adjacent to the polarization plate 400. For example, the photo-curable material may be partially applied on the display panel 100 by a nozzle, etc. Then, the photo-curable material may be pre-cured by ultraviolet light. For example, ultraviolet light may be irradiated on a portion on which the photo-curable material is applied by a light source, such as an UV laser source, etc.

Referring to FIG. 6, in the method of manufacturing the display device according to an embodiment, the post-formed bending protection layer 521 may be formed. The post-formed bending protection layer 521 may be formed on the second area 2A and the bending area BA of the display panel 100 to cover the driving circuit chip 200.

In an embodiment, a thermo-curable material may be applied on the display panel 100 between the first pre-formed bending protection layer 511 and the second pre-formed bending protection layer 512. For example, the thermo-curable material may be entirely applied on the display panel 100 between the first pre-formed bending protection layer 511 and the second pre-formed bending protection layer 512 by a nozzle, etc. For example, the thermo-curable material may have thermo-curable functional group. In this case, the first pre-formed bending protection layer 511 and the second pre-formed bending protection layer 512 may prevent or substantially prevent the thermo-curable material from overflowing. Then, the thermo-curable material may be cured by heat. For example, heat may be supplied on a portion on which the thermo-curable material is applied by a heat source, such as a laser heat source, an ultraviolet heat source, a vacuum dry heat source, etc. In this case, the pre-formed bending protection layer bending protection layers 511 and 512 pre-cured during the light curing process may be cured together with the post-formed bending protection layer 521.

In the present embodiment, the pre-formed bending protection layers 511 and 512 may be formed with the photo-curable material, and the post-formed bending protection layer 521 may be formed with the thermo-curable material. However, the present invention is not limited thereto. In other embodiments, the pre-formed bending protection layers 511 and 512 and the post-formed bending protection layer 521 may be formed with materials including a photo-curable functional group and a thermo-curable functional group, or the pre-formed bending protection layers 511 and 512 and the post-formed bending protection layer 521 may be formed with the same material.

Then, the support film 650 attached on the lower surface of the display panel 100 may be removed. Accordingly, the opening portion OP of the protective film 600 may be formed.

Figure 8:
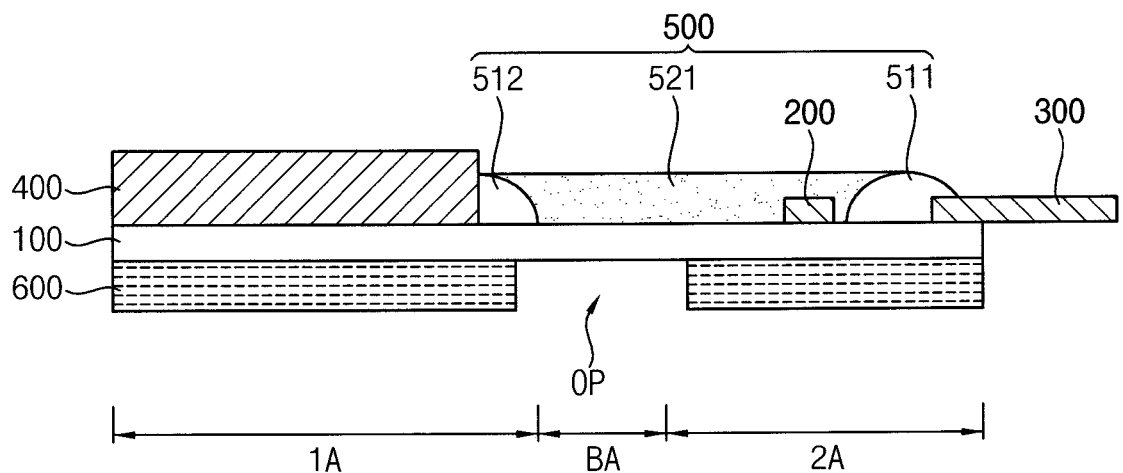
FIG. 8 is a cross-sectional view illustrating a display device according to an embodiment.

FIG. 8 is a cross-sectional view illustrating a display device according to an embodiment.

Referring to FIG. 8, in an embodiment, an upper surface of the first post-formed bending protection layer 521 may be substantially flat. For example, the flat upper surface of the first post-formed bending protection layer 521 may be formed by evenly applying a material for forming the post-formed bending protection layer 521 and curing the material. Alternatively, the flat upper surface of the first post-formed bending protection layer 521 may be formed by forming the first post-formed bending protection layer 521 of which a central portion is convex, and then polishing the convex upper surface with a polishing method, such as chemical mechanical polishing (CMP), or the like.

Figure 9:
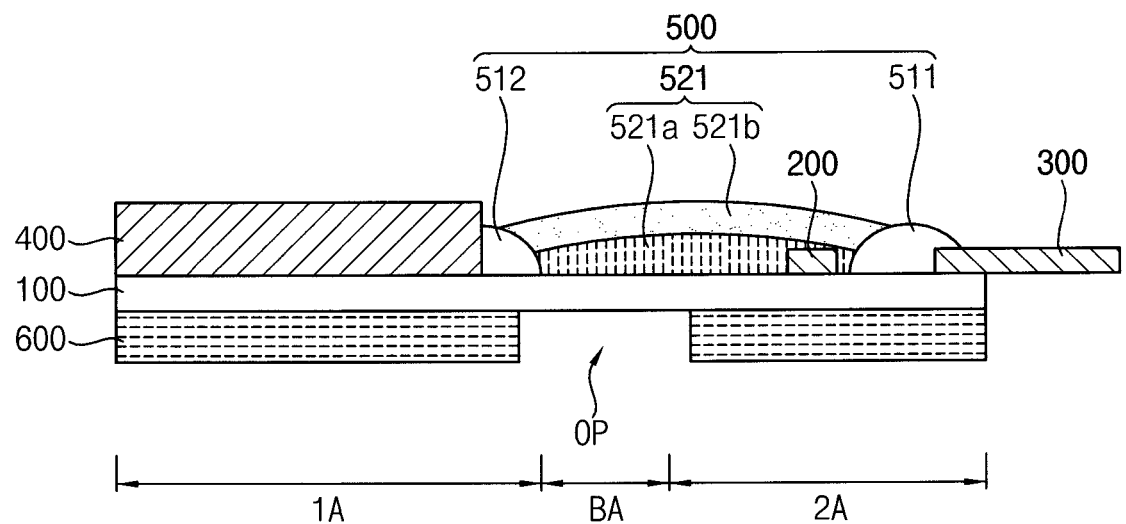
FIG. 9 is a cross-sectional view illustrating a display device according to an embodiment.

FIG. 9 is a cross-sectional view illustrating a display device according to an embodiment.

Referring to FIG. 9, in an embodiment, the first post-formed bending protection layer 521 may include a first layer 521a disposed on the display panel 100 and a second layer 521b disposed on the first layer 521a. For example, the first layer 521a and the second layer 521b may be formed with different materials from each other.

Figure 10:
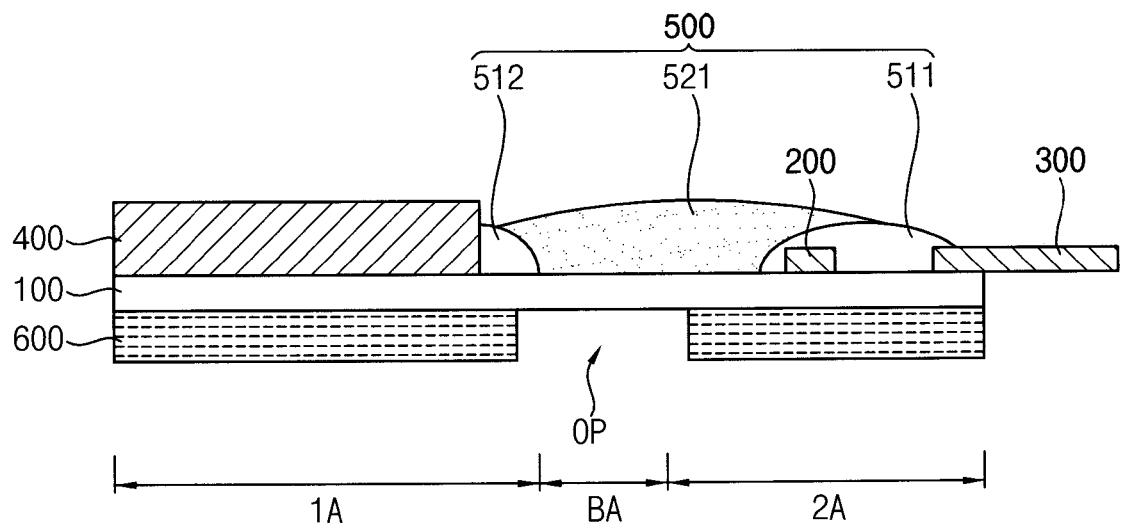
FIG. 10 is a cross-sectional view illustrating a display device according to an embodiment.
Figure 11:
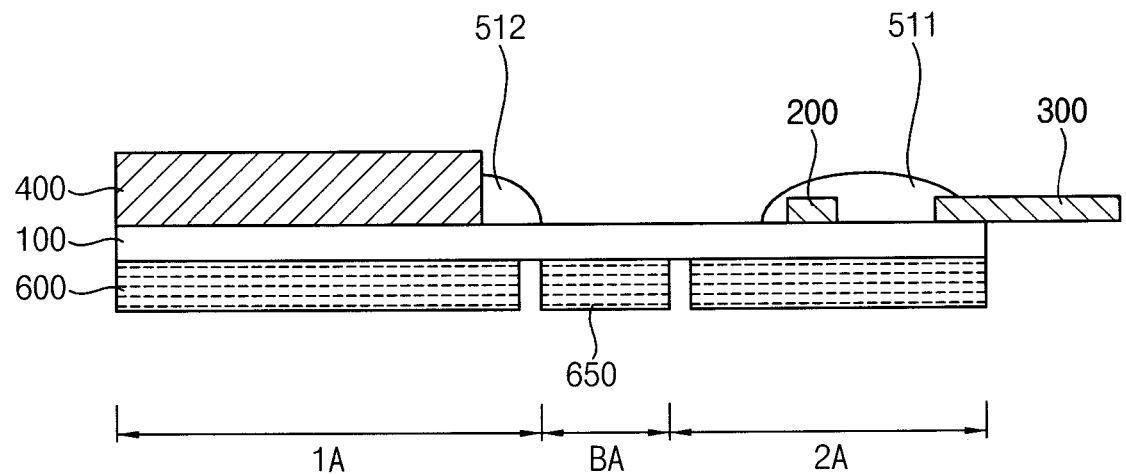
FIG. 11 is a cross-sectional view illustrating a method of manufacturing the display device of FIG. 10.

FIG. 10 is a cross-sectional view illustrating a display device according to an embodiment; and FIG. 11 is a cross-sectional view illustrating a method of manufacturing the display device of FIG. 10.

Referring to FIG. 10, a display device according to an embodiment may include a display panel 100, a driving circuit chip 200, a flexible printed circuit board 300, a polarization plate 400, a bending protection layer 500, and a protective film 600. Further detailed descriptions of elements of the display device according to an embodiment with reference to FIG. 10, which are substantially the same as or similar to those of the display device according to an embodiment with reference to FIG. 6, may be omitted.

In an embodiment, the first pre-formed bending protection layer 511 may cover the driving circuit chip 200. In an embodiment, the first pre-formed bending protection layer 511 may entirely cover the driving circuit chip 200 together with an end of the flexible printed circuit board 300. The first post-formed bending protection layer 521 may be formed between the first pre-formed bending protection layer 511 and the second pre-formed bending protection layer 512, and may not directly cover the driving circuit chip 200.

Referring to FIG. 11, a material for forming the pre-formed bending protection layer may be applied to cover the end of the flexible printed circuit board 300 and the driving circuit chip 200 and cured such that the first pre-formed bending protection layer 511 may be formed. The first pre-formed bending protection layer 511 may cover the driving circuit chip 200, and, therefore, the driving circuit chip 200 may not be affected by external factors such as impact, etc. in a subsequent process for forming the post-formed bending protection layer 521.

Figure 12:
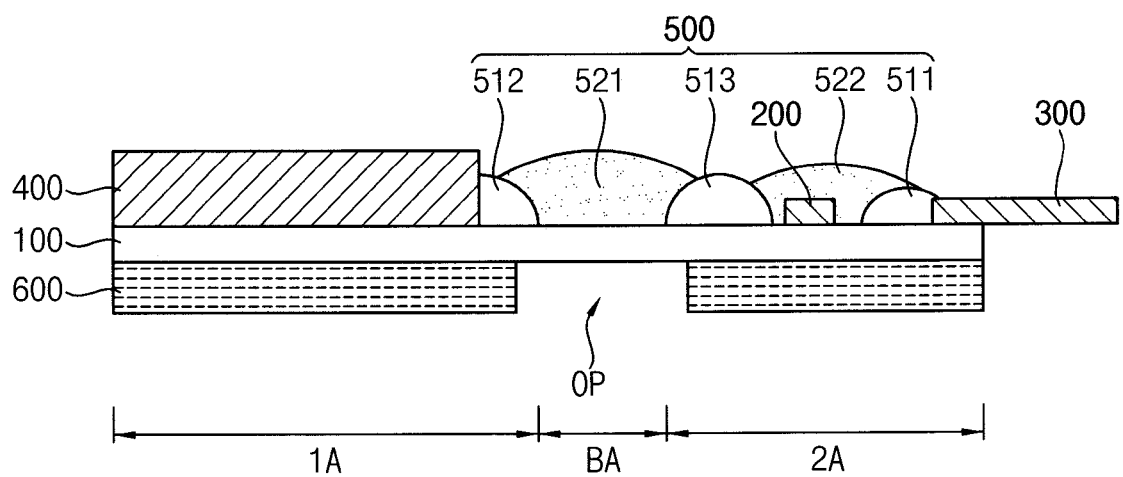
FIG. 12 is a cross-sectional view illustrating a display device according to an embodiment.
Figure 13:
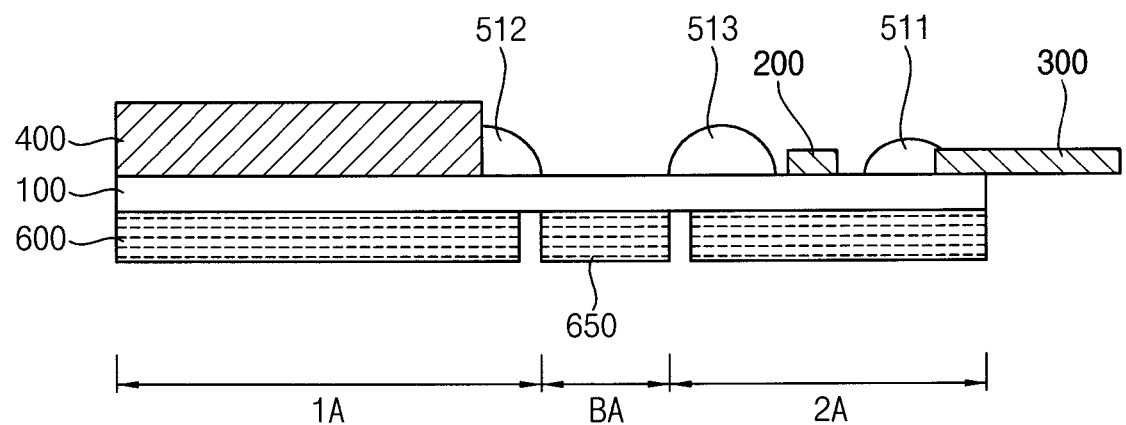
FIG. 13 is a cross-sectional view illustrating a method of manufacturing the display device of FIG. 12.

FIG. 12 is a cross-sectional view illustrating a display device according to an embodiment; and FIG. 13 is a cross-sectional view illustrating a method of manufacturing the display device of FIG. 12.

Referring to FIG. 12, a display device according to an embodiment may include a display panel 100, a driving circuit chip 200, a flexible printed circuit board 300, a polarization plate 400, a bending protection layer 500, and a protective film 600. Further detailed descriptions of elements of the display device according to an embodiment with reference to FIG. 12, which are substantially the same as or similar to those of the display device according to an embodiment with reference to FIG. 6, may be omitted.

The bending protection layer 500 may include a first pre-formed bending protection layer 511, a second pre-formed bending protection layer 512, a third pre-formed bending protection layer 513, a first post-formed bending protection layer 521, and a second post-formed bending protection layer 522. In the formation of the bending protection layer 500, the first post-formed bending protection layer 521 and the second post-formed bending protection layer 522 may be formed after the formation of the first pre-formed bending protection layer 511, the second pre-formed bending protection layer 512, and the third pre-formed bending protection layer 513.

The third pre-formed bending protection layer 513 may be disposed on the second area 2A of the display panel 100 spaced apart from the first pre-formed bending protection layer 511 with the driving circuit chip 200 therebetween. In other words, the driving circuit chip 200 may be located between the first pre-formed bending protection layer 511 and the third pre-formed bending protection layer 513.

In an embodiment, the third pre-formed bending protection layer 513 may overlap an end of the protective film 600 exposed by the opening portion OP in a plan view. A width of the opening portion OP may be greater than a width of the bending area BA, and an edge of the third pre-formed bending protection layer 513 may be adjacent to a boundary between the second area 2A and the bending area BA. Accordingly, the third pre-formed bending protection layer 513 may overlap a portion of the opening portion OP in a plan view.

The first post-formed bending protection layer 521 may be formed between the second pre-formed bending protection layer 512 and the third pre-formed bending protection layer 513, and may cover the bending area BA of the display panel 100. The first post-formed bending protection layer 521 may adjust the location of a stress neutral plane in the bending area BA.

The second post-formed bending protection layer 522 may be formed between the first pre-formed bending protection layer 511 and the third pre-formed bending protection layer 513, and may cover the driving circuit chip 200 disposed on the second area 2A of the display panel 100. For example, the second post-formed bending protection layer 522 may entirely cover the driving circuit chip 200 while being in contact with the first pre-formed bending protection layer 511 and the third pre-formed bending protection layer 513. In this case, the second post-formed bending protection layer 522 may fix the driving circuit chip 200 on the display panel 100.

In an embodiment, a height of the first pre-formed bending protection layer 511 may be lower than a height of the third pre-formed bending protection layer 513. Further, a height of the second post-formed bending protection layer 522 may be lower than a height of the first post-formed bending protection layer 521.

Referring to FIG. 13, a material for forming the pre-formed bending protection layer may be applied on an end of the second area 2A on which the flexible printed circuit board 300 is disposed, a first area 1A adjacent to the bending area BA, and the second area 2A adjacent to the bending area BA, and cured such that the first pre-formed bending protection layer 511, the second pre-formed bending protection layer 512, and the third pre-formed bending protection layer 513 may be formed. Here, the first pre-formed bending protection layer 511 may be formed to have a height lower than a height of the third pre-formed bending protection layer 513 such that the first post-formed bending protection layer 521 and the second post-formed bending protection layer 522 may be formed to have different heights in a subsequent process.

Then, a material for forming the post-formed bending protection layer may be applied between the second pre-formed bending protection layer 512 and the third pre-formed bending protection layer 513 and between the first pre-formed bending protection layer 511 and the third pre-formed bending protection layer 513, and cured such that the first post-formed bending protection layer 521 and the second post-formed bending protection layer 522 may be formed as shown in FIG. 12. As described above, in an embodiment, the height of the first pre-formed bending protection layer 511 may be lower than the height of the second pre-formed bending protection layer 513 such that the second post-formed bending protection layer 522 may be formed to have a height lower than a height of the first post-formed bending protection layer 521. The height of the second post-formed bending protection layer 522 may be relatively low such that a volume of the second post-formed bending protection layer 522 may be relatively small. Therefore, a manufacturing cost and a manufacturing time of the second post-formed bending protection layer 522 may be reduced.

The display device according to the embodiments of the present invention may be applied to a display device included in a computer, a notebook, a mobile phone, a smartphone, a smart pad, a PMP, a PDA, an MP3 player, or the like.

Although the display devices and the methods of manufacturing the display devices according to some embodiments of the present invention have been described with reference to the drawings, the illustrated embodiments are examples, and may be modified or changed by a person having ordinary skill or knowledge in the relevant technical field without departing from the technical spirit of the present invention, as described in the following claims.

What is claimed is:

1. A display device comprising:
a display panel comprising a first area, a second area spaced apart from the first area, and a bending area between the first area and the second area;
a driving circuit chip on the second area of the display panel;
a flexible printed circuit board on the second area of the display panel and spaced apart from the driving circuit chip in a direction away from the bending area; and
a bending protection layer comprising a first pre-formed bending protection layer covering a portion of the flexible printed circuit board, and a first post-formed bending protection layer covering the bending area of the display panel,
wherein the first pre-formed bending protection layer does not overlap the driving circuit chip in a plan view.

2. The display device of claim 1, wherein the first post-formed bending protection layer comprises a same material as that of the first pre-formed bending protection layer.

3. A display device comprising:
a display panel comprising a first area, a second area spaced apart from the first area, and a bending area between the first area and the second area;
a driving circuit chip on the second area of the display panel;
a flexible printed circuit board on the second area of the display panel and spaced apart from the driving circuit chip; and
a bending protection layer comprising a first pre-formed bending protection layer covering a portion of the flexible printed circuit board, and a first post-formed bending protection layer covering the bending area of the display panel,
wherein the first pre-formed bending protection layer comprises a photo-curable material, and
wherein the first post-formed bending protection layer comprises a thermo-curable material.

4. The display device of claim 1, wherein a hardness of the first pre-formed bending protection layer is greater than a hardness of the first post-formed bending protection layer.

5. The display device of claim 1, wherein the first post-formed bending protection layer covers the driving circuit chip.

6. The display device of claim 1, wherein the first pre-formed bending protection layer covers the driving circuit chip.

7. The display device of claim 1, wherein the bending protection layer further comprises a second pre-formed bending protection layer on the first area of the display panel.

8. A display device comprising:
a display panel comprising a first area, a second area spaced apart from the first area, and a bending area between the first area and the second area;
a driving circuit chip on the second area of the display panel;
a flexible printed circuit board on the second area of the display panel and spaced apart from the driving circuit chip; and
a bending protection layer comprising a first pre-formed bending protection layer covering a portion of the flexible printed circuit board, and a first post-formed bending protection layer covering the bending area of the display panel,
wherein the bending protection layer further comprises a second pre-formed bending protection layer on the first area of the display panel, and
wherein the bending protection layer further comprises:
a third pre-formed bending protection layer on the second area of the display panel and spaced apart from the first pre-formed bending protection layer with the driving circuit chip therebetween; and
a second post-formed bending protection layer between the first pre-formed bending protection layer and the third pre-formed bending protection layer and covering the driving circuit chip.

9. The display device of claim 8, wherein a height of the first pre-formed bending protection layer is lower than a height of the third pre-formed bending protection layer.

10. The display device of claim 9, wherein a height of the second post-formed bending protection layer is lower than a height of the first post-formed bending protection layer.

11. The display device of claim 7, further comprising a protective film opposite to the bending protection layer with the display panel therebetween and comprising an opening portion corresponding to the bending area of the display panel.

12. The display device of claim 11, wherein the second pre-formed bending protection layer overlaps an end of the protective film which is exposed by the opening portion in a plan view.

13. The display device of claim 1, wherein an upper surface of the first post-formed bending protection layer is flat.

14. The display device of claim 1, wherein the first post-formed bending protection layer comprises a first layer on the display panel and a second layer on the first layer and comprising a different material from that of the first layer.

15. The display device of claim 1, further comprising a polarization plate on the first area of the display panel, and
wherein the bending protection layer is in contact with the polarization plate.

16. A method of manufacturing a display device, the method comprising:
forming a display panel comprising a first area, a second area spaced apart from the first area, and a bending area between the first area and the second area;

attaching a driving circuit chip on the second area of the display panel;

attaching a flexible printed circuit board spaced apart from the driving circuit chip in a direction away from the bending area on the second area of the display panel;

forming a pre-formed bending protection layer covering a portion of the flexible printed circuit board; and forming a post-formed bending protection layer covering the bending area of the display panel, wherein the pre-formed bending protection layer does not overlap the driving circuit chip in a plan view.

17. A method of manufacturing a display device, the method comprising:

forming a display panel comprising a first area, a second area spaced apart from the first area, and a bending area between the first area and the second area;

attaching a driving circuit chip on the second area of the display panel;

attaching a flexible printed circuit board spaced apart from the driving circuit chip on the second area of the display panel;

forming a pre-formed bending protection layer covering a portion of the flexible printed circuit board; and forming a post-formed bending protection layer covering the bending area of the display panel, wherein forming the pre-formed bending protection layer comprises:

coating a photo-curable material on the second area of the display panel and the portion of the flexible printed circuit board; and pre-curing the photo-curable material with an ultraviolet light.

18. The method of claim 17, wherein forming the post-formed bending protection layer comprises:

coating a thermo-curable material on the bending area of the display panel; and curing the thermo-curable material with heat.

19. The method of claim 16, wherein forming the post-formed bending protection layer is performed after forming the pre-formed bending protection layer.

* * * * *